United States Patent
Kondo

(10) Patent No.: US 9,691,953 B2
(45) Date of Patent: Jun. 27, 2017

(54) LIGHT EMITTING ELEMENT AND LIGHT EMITTING DEVICE

(71) Applicant: NICHIA CORPORATION, Anan-shi, Tokushima (JP)

(72) Inventor: Hiroki Kondo, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/240,574

(22) Filed: Aug. 18, 2016

(65) Prior Publication Data

US 2017/0062676 A1    Mar. 2, 2017

(30) Foreign Application Priority Data

Aug. 26, 2015   (JP) .................................. 2015-166325

(51) Int. Cl.
*H01L 33/38* (2010.01)
*H01L 33/58* (2010.01)
(Continued)

(52) U.S. Cl.
CPC ............ *H01L 33/58* (2013.01); *H01L 33/507* (2013.01); *H01L 33/52* (2013.01)

(58) Field of Classification Search
CPC ........... H01L 2924/00014; H01L 33/20; H01L 33/38; H01L 33/44; H01L 2933/0016;
(Continued)

(56) References Cited

U.S. PATENT DOCUMENTS 7,442,254 B2 * 10/2008 Kiyoku .................. B82Y 20/00
117/95
7,615,798 B2 * 11/2009 Sanga ..................... H01L 33/20
257/103

(Continued)

FOREIGN PATENT DOCUMENTS

| JP | 2010-080542 A | 4/2010 |
| JP | 2013-004546 A | 1/2013 |
| JP | 2013-232541 A | 11/2013 |

*Primary Examiner* — Jaehwan Oh
(74) *Attorney, Agent, or Firm* — Foley & Lardner LLP

(57) ABSTRACT

A light emitting element includes a semiconductor stack including an n-side semiconductor layer, and a p-side semiconductor layer disposed in a portion of an area above the n-side semiconductor layer, the semiconductor stack having a plurality of first lateral surfaces and a plurality of second lateral surfaces; an n-pad electrode disposed in an area different from an area where the p-side semiconductor layer is disposed above the n-side semiconductor layer, the n-pad electrode being electrically connected to the n-side semiconductor layer, and the n-pad electrode having a plurality of lateral surfaces that oppose the first lateral surfaces of the semiconductor stack; a first light transmissive film disposed in contact with the first lateral surfaces of the semiconductor stack; and a second light transmissive film disposed in contact with the second lateral surfaces of the semiconductor stack. A refractive index of the second light transmissive film is lower than a refractive index of the semiconductor stack, and higher than a refractive index of the first light transmissive film.

6 Claims, 10 Drawing Sheets

(51) Int. Cl.
*H01L 33/52* (2010.01)
*H01L 33/50* (2010.01)

(58) Field of Classification Search
CPC ....... H01L 33/007; H01L 33/22; H01L 33/32; H01L 33/0079
See application file for complete search history.

(56) References Cited

U.S. PATENT DOCUMENTS

| | | | |
|---|---|---|---|
| 2006/0081868 A1* | 4/2006 | Kotani | B82Y 20/00 257/99 |
| 2006/0124954 A1* | 6/2006 | Akaishi | H01L 33/38 257/99 |
| 2007/0228393 A1* | 10/2007 | Yoneda | H01L 33/22 257/79 |
| 2010/0072501 A1* | 3/2010 | Wakai | H01L 33/20 257/98 |
| 2010/0072508 A1 | 3/2010 | Kamiya et al. | |
| 2010/0201254 A1* | 8/2010 | Matsumura | H01L 33/387 313/501 |
| 2010/0264443 A1* | 10/2010 | Wakai | H01L 33/20 257/98 |
| 2011/0220942 A1* | 9/2011 | Choi | H01L 33/32 257/98 |
| 2011/0316126 A1* | 12/2011 | Emura | H01L 33/44 257/632 |
| 2013/0026487 A1* | 1/2013 | Musashi | H01L 33/0095 257/76 |
| 2013/0285099 A1 | 10/2013 | Hodota | |
| 2014/0227813 A1* | 8/2014 | Yoneda | H01L 33/0095 438/33 |
| 2016/0240757 A1* | 8/2016 | Daikoku | H01L 33/38 |

\* cited by examiner

LIGHT EMITTING ELEMENT AND LIGHT EMITTING DEVICE

CROSS-REFERENCE TO RELATED APPLICATION

This application claims priority to Japanese Patent Application No. 2015-166325, filed on Aug. 26, 2015, the disclosure of which is hereby incorporated by reference in its entirety.

BACKGROUND

The present disclosure relates to light emitting elements and light emitting devices.

In recent years, GaN-based compound semiconductors have been used for light emitting elements. As a general GaN-based compound semiconductor light emitting element structure, if a single crystal sapphire substrate is used, an n-side semiconductor layer, an active layer, and a p-side semiconductor layer are stacked in that order. Because the sapphire substrate is an insulator, the p-electrode formed on the p-side semiconductor layer and the n-electrode formed on the n-side semiconductor are present on the same side. There are two types of such light emitting elements: a face-up type, in which a light transmissive electrode is used as the p-electrode to extract light from the p-side semiconductor layer side, and a face-down or flip chip type in which a light reflecting film of Ag or the like is used as the p-electrode to extract light from the sapphire substrate side.

In the case of a face-up type light emitting element, a thin metal film such as Ni/Au, a conductive metal oxide film such as ITO, or the like is used for the light transmissive electrode. The surface of the light emitting element is covered by a protective film made of a light transmissive insulating material as described in Japanese Patent Application Publication No. 2010-080542.

In the case of a face-up type light emitting element, light is extracted from not only the upper surface of the semiconductor stack of the light emitting element, but also from the lateral surfaces of the semiconductor stack through the protective film. As disclosed in the above referenced patent document, an oxide such as $SiO_2$, which has good insulating and light transmitting properties, is used for the protective film.

Here, in the case where GaN having approximately 2.4 of reflective index is used for the semiconductor stack, and $SiO_2$ having approximately 1.5 of reflective index is used for the protective film as the suitable material, there is a large difference between the reflective index of the components.

For this reason, an increased percentage of the light traveling externally from the lateral surfaces of the semiconductor stack is reflected at the interfaces between the semiconductor stack and the protective film. The light can be absorbed by pad electrodes or the like while being repeatedly reflected inside the light emitting element, which could reduce the light extraction efficiency.

On the other hand, in the area where the n-pad electrode is disposed near a lateral surface of the semiconductor stack, the light emitted from the lateral surface tends to be relatively easily absorbed by the n-pad electrode. For this reason, allowing the light to be reflected at the interfaces between the semiconductor stack and the protective film in the area near the n-pad electrode so as to be extracted from the upper surface and the lateral surfaces of the other area can better increase the light extraction efficiency. In other words, simply increasing the transmittance of the protective film would not necessarily increase the light extraction efficiency.

Certain embodiments of the present invention aim to increase the light extraction efficiency of a light emitting element and a light emitting device using the light emitting element.

SUMMARY

The light emitting element according to one embodiment of the invention comprises: a semiconductor stack having an n-side semiconductor layer, a p-side semiconductor layer disposed in a portion of the area above the n-side semiconductor layer; an n-pad electrode disposed in an area different from the area where the p-side semiconductor layer is disposed above the n-side semiconductor layer and electrically connected to the n-side semiconductor layer; a first light transmissive film disposed in contact with the first lateral surfaces opposing the lateral surfaces of the n-pad electrode among the lateral surfaces of the semiconductor stack; and a second light transmissive film disposed in contact with the second lateral surfaces different from the first lateral surfaces among the lateral surfaces of the semiconductor stack; wherein the refractive index of the second light transmissive film is lower than the refractive index of the semiconductor stack, but higher than the refractive index of the first light transmissive film.

According to the light emitting element of the embodiment of the invention, the lateral surfaces of the semiconductor stack not opposing the pad electrodes are covered by the second light transmissive film having a higher refractive index than that of the first light transmissive film which covers the other lateral surfaces, thereby increasing the light extraction efficiency.

DESCRIPTION

Figure 1A:
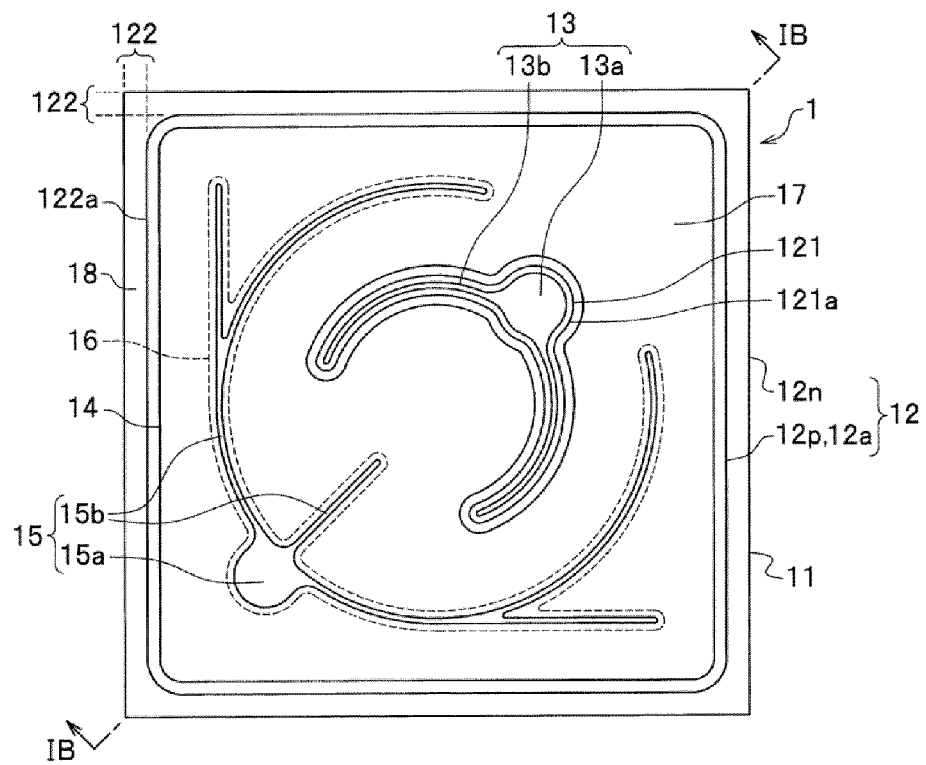
FIG. 1A is a plan view showing the structure of the light emitting element according to Embodiment 1.

Light emitting elements and the light emitting devices according to certain embodiments of the present invention will be explained below.

The drawings referenced in the explanations below are schematic views of the embodiments, and the scale, the spacing, and the positional relationships of the members and components may be exaggerated or partially omitted. The scaling and spacing of the members and components may not match between the plan views and the sectional views. In the explanation below, moreover, the same designations and reference numerals are used for the same members or those of the same nature as a rule, the detailed explanation for which will be omitted when appropriate.

In the light emitting elements and light emitting devices according to each embodiment, terms such as "upper," "lower," "left," and "right" might switch depending on the situation. In this specification, terms such as "upper" and "lower" indicate the relative positions of the constituent elements in the drawings being referred to for the purpose of explanation, and are not intended to indicate their absolute positions unless otherwise specified.

Embodiment 1

Light Emitting Device Structure

The structure of the light emitting element and the light emitting device using the light emitting element according to Embodiment 1 will be explained with reference to FIG. 1A to FIG. 3.

The light emitting element 1 according to this embodiment, as shown in FIG. 1A, is substantially square shaped in a plan view, and includes a substrate 11, a semiconductor stack 12, an n-electrode 13, a light transmissive electrode 14, a p-electrode 15, an insulation film 16, a first light transmissive film 17, and a second light transmissive film 18. The light emitting element 1 has a structure suitable for face-up mounting in which the n-electrode 13, the light transmissive electrode 14, and the p-electrode 15 are disposed on one surface of the semiconductor stack 12 on the substrate 11.

Figure 2:
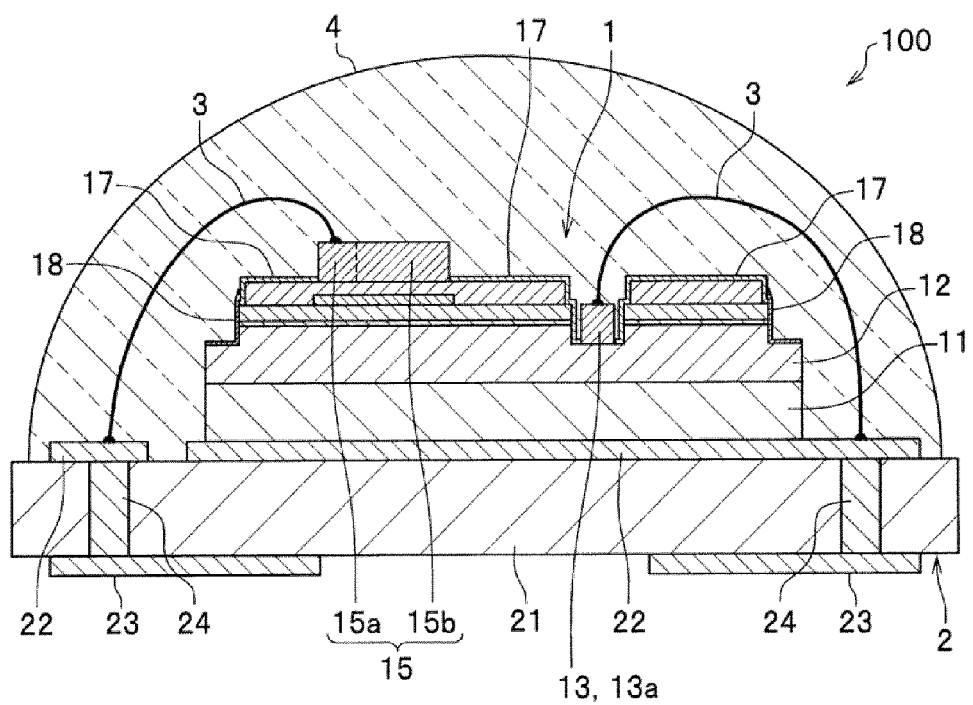
FIG. 2 is a sectional view showing the structure of the light emitting device according to Embodiment 1.

The light emitting device 100 according to this embodiment, as shown in FIG. 2, is such that the light emitting element 1 is mounted on the mounting substrate 2, and the light emitting element 1 is covered by the sealing member 4.

In the plan view shown in FIG. 1A, the outlines of the first light transmissive film 17 and the second light transmissive film 18 are omitted.

The substrate 11 supports the semiconductor stack 12. The substrate 11 may be a growth substrate which allows for the epitaxial growth of the semiconductor stack 12. In the case of employing a nitride semiconductor for the semiconductor stack 12, for example, a sapphire ($Al_2O_3$) substrate can be used for the substrate 11.

The semiconductor stack 12 is formed by stacking an n-side semiconductor layer 12n on the upper surface that is one of the principal planes of the substrate 11, and a p-side semiconductor layer 12p disposed over the n-side semiconductor layer 12n in an area of the n-side semiconductor layer 12n. The semiconductor stack 12 emits light when a current runs between the n-electrode 13, which is disposed in an area over the n-side semiconductor 12n different from the area where the p-side semiconductor layer 12p is disposed, and is electrically connected to the n-side semiconductor layer 12n, and the p-electrode 15, which is disposed over the p-side semiconductor layer 12p and is electrically connected to the p-side semiconductor layer 12p. The semiconductor stack 12 preferably includes an active layer 12a between the n-side semiconductor layer 12n and the p-side semiconductor layer 12p.

Using the emission area, which is the active layer 12a in this embodiment, as a reference, the semiconductor to be connected to the n-electrode 13 is the n-side semiconductor layer 12n and the semiconductor to be connected to the p-electrode 15 is the p-side semiconductor layer 12p.

The semiconductor stack 12 has areas where both the p-side semiconductor layer 12p and the active layer 12a are absent, i.e., the areas indented from the surface of the p-side semiconductor layer 12p where the n-side semiconductor layer 12n is exposed. The areas where the n-side semiconductor layer 12n is exposed include a first area 121 for disposing an n-electrode 13, and second areas 122 that include the outer edges of the semiconductor stack 12.

The bottom surfaces and the lateral surfaces of the first area 121 and the second areas 122 are covered by the n-electrode 13, the first light transmissive film 17, the second light transmissive film 18, and the like, in a completed light emitting element 1, but for the sake of convenience, they are occasionally described as "exposed" when explaining the structure of the semiconductor stack 12 in this specification.

The first area 121 provided in the central area of the semiconductor stack 12 in a plan view is substantially shaped as the letter C. The n-electrode 13 is disposed along the letter C shape at the bottom surface of the first area 121. The second areas 122 are provided along the outer edges of the substantially square shape semiconductor stack 12 in a plan view, i.e., it is disposed in the bordering areas along the borders, the so-called dicing streets, which define individual light emitting elements 1 on a wafer.

The lateral surfaces 121a of the first area 121 and the lateral surfaces 122a of the second areas 122 are all lateral surfaces (end faces) of the semiconductor stack 12, where the p-side semiconductor layer 12p and the active layer 12a are exposed. The first light transmissive film 17 is disposed in contact with the lateral surfaces (first lateral surfaces) 121a of the first area 121 among such lateral surfaces of the semiconductor stack 12, while the second light transmissive film 18 is disposed in contact with the lateral surfaces (second lateral surfaces) 122a of the second areas 122.

The lateral surfaces 121a of the first area 121 oppose the lateral surfaces of the n-electrode 13 disposed at the bottom surface of the first area 121. The n-electrode 13 is constructed with a metal material and has a relatively high light absorption. The first light transmissive film 17 having a relatively low refractive index is disposed at the lateral surfaces 121a so that the lateral surfaces 121a which are the interfaces between the semiconductor stack 12 and the first light transmissive film 17 can function as light reflecting surfaces. This can reduce the amount of light emitted from the lateral surfaces 121a towards the n-electrode 13, thereby reducing the loss of light due to absorption by the n-electrode 13.

Nothing that obstructs light extraction similar to the n-electrode 13 is provided at the second areas 122. Thus, the second light transmissive film 18 having a lower refractive index than that of the semiconductor stack 12, but a higher refractive index than that of the first light transmissive film 17 is provided here in lieu of the first light transmissive film 17 so as to efficiently extract light from the lateral surfaces 122a. This makes the refractive index difference between the second light transmissive film 18 and the semiconductor stack 12 smaller than the refractive index difference between the first light transmissive film 17 and the semiconductor stack 12, reducing the reflection at the interfaces between the second light transmissive film 18 and the semiconductor stack 12. In other words, the light transmittance of the second light transmissive film 18 can be made higher than that of the first light transmissive film 17.

The light transmittances achieved by the first light transmissive film 17 and the second light transmissive film 18 will be described in detail later.

For the materials for the n-side semiconductor layer 12n, the active layer 12a and the p-side semiconductor layer 12p making up the semiconductor stack 12, for example, a nitride semiconductor represented by $In_XAl_YGa_{1-X-Y}N$ ($0 \leq X$, $0 \leq X+Y<1$) can be used.

The light transmissive electrode 14 is disposed to cover substantially the entire surface of the upper surface of the p-side semiconductor layer 12p and functions as a current diffusion layer for diffusing the current supplied from the outside via the p-electrode 15 across the entire surface of the p-side semiconductor layer 12p. Substantially the entire surface here refers to the area of the upper surface of the p-side semiconductor layer 12p excluding the inner edge of the first area 121 and the outer edges along the second areas 122. For example, the light transmissive electrode 14 is preferably disposed on at least 90% of the upper surface of the p-side semiconductor layer 12p.

The insulation film 16 is provided on the upper surface of the p-side semiconductor layer 12p in the area directly under the p-electrode 15 and its vicinity, and the light transmissive electrode 14 is disposed on the p-side semiconductor layer 12p via the insulation film 16.

In the case where the light emitting element 1 is of a face-up mounting type, the light emitted by the semiconductor stack 12 is primarily extracted from the upper surface via the light transmissive electrode 14. For this purpose, the light transmissive electrode 14 preferably has good transmittance relative to the light emitted by the semiconductor stack 12.

Examples of the light transmitting conductive materials used for the light transmissive electrode 14 include metal thin film and conductive metal oxides. Furthermore, examples of conductive metal oxides include oxides containing at least one element selected from the group consisting of zinc (Zn), indium (In), tin (Sn), gallium (Ga), and titanium (Ti). Among all, ITO (Sn-doped $In_2O_3$) is a suitable material to cover substantially the entire surface of the upper surface of the p-side semiconductor layer 12p, as it is a highly conductive material having high transmittance with respect to visible light (visible spectrum).

The n-electrode 13 is a pad electrode (n-pad electrode) disposed to be electrically connected to the n-side semiconductor layer 12n in the first area 121 of the semiconductor stack 12 for supplying current from the outside to the light emitting element 1. For example, Cu, Pt, Au, or an alloy having any of these metals as a main component can be used for the n-electrode 13 to be suitable for external connection by wire bonding or the like. A light reflecting layer using a metal material having a good light reflectance may be provided as the lowermost layer of the n-electrode 13, i.e., on the n-side semiconductor layer 12n side. Metal materials having a good light reflectance include Al, Ru, Ag, Ti, Ni, or an ally having any of these as a main component.

Both the external connection portion 13a and the extended portion 13b of the n-electrode 13 are composed of the same material.

The n-electrode 13 is disposed along the C letter shape of the first area 121 in a plan view. The n-electrode 13 is composed of an external connection portion 13a, which is circular in shape and formed near the center, and an arc-shaped extended portion 13b which extends from the external connection portion 13a. The external connection portion 13a is an area for external connection, and the extended portion 13b functions to efficiently diffuse the current supplied from the external connection portion 13a across the entire area of the n side semiconductor layer 12n.

The p-electrode 15 is a pad electrode (p-pad electrode) for supplying the current from the outside to the light emitting element 1, and is provided in one portion of the upper surface of the light transmissive electrode 14. The p-electrode 15 is electrically connected to the p-side semiconductor layer 12p via the light transmissive electrode 14, and is composed of a substantially circular external connection portion 15a in a plan view and an extended portion 15b which extends from the external connection portion 15a and placed over a wide range of the p-side semiconductor layer 12p in a plan view. The external connection portion 15a is an area for external connection, and the extended portion 15b functions to efficiently diffuse the current supplied from the external connection portion 15a across the entire area of the light transmissive electrode 14.

The extended portion 15b has an arc-shaped part extending so as to surround the n-electrode 13, linear parts that branch out from the arc, and a section linearly extending from the external connection section 15a towards the external connection portion 13a of the n-electrode 13. The external connection portion 13a of the n-electrode 13 and the external connection portion 15a of the p-electrode 15 are located spaced apart on a diagonal line of the light emitting element 1 which is substantially square in a plan view.

As described earlier, the insulation film 16 is disposed between the p-side semiconductor layer 12p and the light transmissive electrode 14 in the area directly under the p-electrode 15 and its vicinity in a plan view.

The p-electrode 15 can be formed with Cu, Au, or an alloy having either of these as a main component, for example, so that the external connection portion 15a is suitable for external connection by wire bonding or the like, similar to the external connection portion 13a of the n-electrode 13 described earlier. Moreover, a light reflecting layer using a metal material having a good light reflectance may be provided as the lowermost layer of the p-electrode 15, i.e., on the light transmissive electrode 14 side, similar to the n-electrode 13 described earlier.

Both the external connection portion 15a and the extended portion 15b of the p-electrode 15 are composed of the same material.

The insulation film 16 is disposed on the p-side semiconductor layer 12p in the area directly under the p-electrode 15 and its vicinity so as to encompass the p-electrode 15 in a plan view. Providing the insulation film 16 between the p-side semiconductor layer 12p and the light transmissive electrode 14 can moderate the current flowing to the p-side semiconductor layer 12p directly under the p-electrode 15, thereby reducing the emission in the area. By reducing the amount of light propagating towards the p-electrode 15, the amount of light absorbed by the p-electrode 15 can be reduced. As a result, the light extraction efficiency relative to the amount of emission from the semiconductor stack 12 as a whole can be increased.

The insulation film 16, moreover, is preferably made of a material having light transmittance, more preferably having a lower refractive index than that of the semiconductor stack 12. Providing an insulation film 16 made of such a material on the p-side semiconductor layer 12p enables total internal reflection of the light propagating upwardly inside the semiconductor stack 12 at the interface between the p-side semiconductor layer 12p and the insulation film 16 based on Snell's law, in addition to the interfacial reflection based on the refractive index difference. Accordingly, by disposing the insulation film 16 in the area directly under the p-electrode 15 and its vicinity, and efficiently reflecting the light traveling towards the p-electrode 15 before it, the absorption of light by the p-electrode 15 can be reduced.

The insulation film 16 can be formed by suitably using an oxide such as $SiO_2$, $TiO_2$, $Al_2O_3$ or the like, a nitride such as $Si_3N_4$ or the like, or a fluoride such as $MgF_2$ or the like. Among all, $SiO_2$ which has a low refractive index, can suitably be used.

The insulation film 16 may be omitted.

The first light transmissive film 17 is a protective film having insulating properties disposed to cover the upper surface, excluding the areas where the n-electrode 13 and the p-electrode 15 are disposed, and lateral surfaces of the light transmissive electrode 14, and the upper surface and the lateral surfaces 121a of the first area 121.

The first light transmissive film 17 is disposed such that its interface with the semiconductor stack 12 functions as a high efficiency light reflecting surface as compared to the second light transmissive film 18 particularly at the lateral surfaces 121a of the first area 121. For this purpose, a material of lower refractive index than that of the semiconductor stack 12 and the second light transmissive film 18 is used for the first light transmissive film 17.

Moreover, making the refractive index of the first light transmissive film 17 lower than that of the semiconductor stack 12 allows for the interface with the semiconductor stack 12 to function as a total reflection surface based on Snell's law.

For this purpose, it is preferable to form the first light transmissive film 17 to a sufficient thickness to allow the interface with the semiconductor stack 12 to function as the total internal reflection surface based on Snell's law. Assuming that the vacuum wavelength of the light emitted by the light emitting element 1 is λ and the refractive index of the first light transmissive film 17 is n, the thickness of the first light transmissive film 17 is preferably at least twice, more preferably at least three times, the value obtained by λ/(4·n).

Here, the reflectance R of the light perpendicularly incident on the interface of two media A and B having different refractive indices can be calculated, assuming that the refractive indices of the media A and B are $n_A$ and $n_B$, by the following formula (1):

$$R=\{(n_A-n_B)/(n_A+n_B)\}^2 \qquad (1)$$

In other words, the larger the refractive index difference, the higher the reflectance of light can be.

Moreover, the critical angle for the total internal reflection based on Snell's law becomes smaller as the refractive index difference from the semiconductor stack 12 increases. This increases the percentage of the light that is incident on the interface at various angles, which results in total internal reflection.

Accordingly, providing a lower refractive index than that of the second light transmissive film 18 to the first light transmissive film 17 can achieve a higher reflectance of light than that of the second light transmissive film 18.

For the first light transmissive film 17, materials similar to those described previously for the insulation film 16 can be used. $SiO_2$ which has good transmittance and a relatively low refractive index can suitably be used.

The first light transmissive film 17, as described earlier, covers the light transmissive electrode 14. Thus, light is extracted from the upper surface of the light emitting element 1 via the semiconductor stack 12, the light transmissive electrode 14, and the first light transmissive film 17. At this time, it is preferable to select the materials so that the further out the material, the lower the refractive index becomes, sequentially from the semiconductor stack 12, the light transmissive electrode 14, and the first light transmissive film 17. As an example of such a combination, GaN for the semiconductor stack 12, ITO for the light transmissive electrode 14, and $SiO_2$ for the first light transmissive film 17 can be used. This can increase the light extraction efficiency from the upper surface of the light emitting element 1.

Next, the aforementioned improved efficiency in extracting light from the upper surface of the light emitting element 1 will be explained. Having an interface with a large refractive index difference, such as the interface between GaN and $SiO_2$ in the light extraction path from the semiconductor stack 12 to the outside reduces the light transmittance. On the contrary, even if the number of interfaces increased, the light transmittance of the entire path can be increased by making the refractive index difference at each interface small. For example, light transmittance of the upper surface side light extraction path of the light emitting element 1 where GaN/ITO/$SiO_2$ are stacked can be made higher than that of the light extraction path at the lateral surfaces of the first area 121 where GaN/$SiO_2$ are stacked.

The second light transmissive film 18 has insulation properties, and is a protective film disposed to cover the lateral surfaces 122a and the upper surfaces of the second areas 122 of the semiconductor stack 12. For the second light transmissive film 18, a material having a lower refractive index than that of the semiconductor stack 12, but a higher refractive index than that of the first light transmissive film 17 is used. This reduces the reflection at the interface with the semiconductor stack 12 because the refractive index difference with the semiconductor stack 12 is small. In other words, the second light transmissive film 18 is constructed to have a higher light transmittance than that of the first light transmissive film 17.

Providing the second light transmissive film 18 having a higher light transmittance than the first light transmissive film 17 in the second areas 122 facilitates the efficient light extraction from the semiconductor stack 12 at the lateral surfaces 122a.

The ends of the second light transmissive film 18 cover the ends of the first light transmissive film 17 from the outside. Forming the first light transmissive film 17 and the second light transmissive film 18 so that they overlap at their borders can prevent the barrier function of these protective films from declining.

The second light transmissive film 18 is preferably an anti-reflection (AR) film. An AR film can be achieved by setting the thickness of the second light transmissive film 18 as defined below.

Assuming that the refractive index of the second light transmissive film 18 is n, and the vacuum wavelength of the light emitted by the light emitting element 1 is k, the film thickness t can be defined by the formula (2) below.

$$t=\lambda/(4 \cdot n) \quad (2)$$

As shown in formula (2), the reflectance of light having wavelength λ can be minimized by setting the film thickness to one fourth of the wavelength of the light propagating through the second light transmissive film 18.

Figure 3:
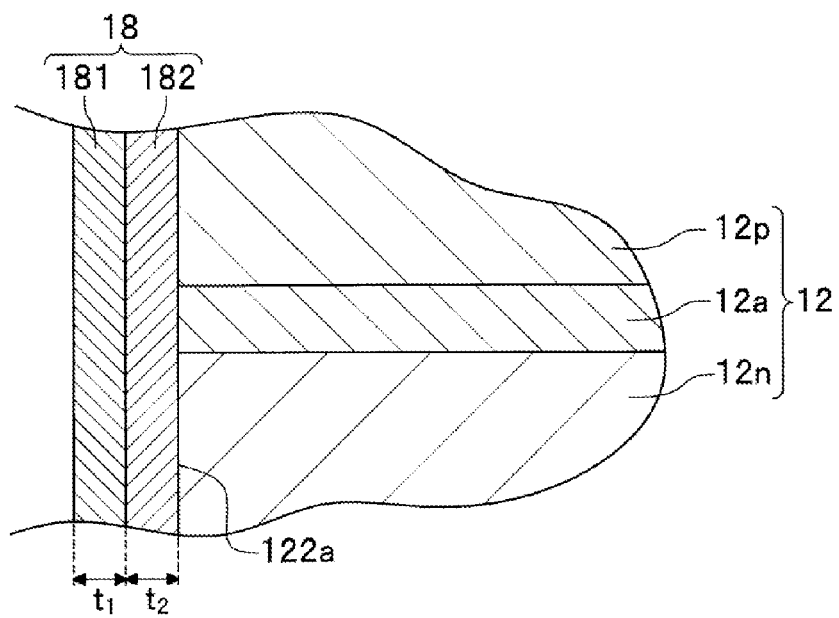
FIG. 3 is a sectional view partially enlarging the second light transmissive film in the light emitting element according to Embodiment 1.

Moreover, the second light transmissive film 18 is not limited to a single layer film, and can be a multilayer film stacking two or more layers of light transmissive materials of different refractive indices as shown in FIG. 3. In the example shown in FIG. 3, the second light transmissive film 18 is a two-layer film composed of a first layer 181 which has a film thickness $t_1$ and refractive index $n_1$ and a second layer 182 which has a film thickness $t_2$ and refractive index $n_2$.

In this case, the film thickness $t_1$ of the first layer 181 and the film thickness $t_2$ of the second layer 182 are defined by the following formulas (2-1) and (2-2), respectively:

$$t_1=\lambda/(4 \cdot n_1) \quad (2\text{-}1)$$

$$t_2=\lambda/(4 \cdot n_2) \quad (2\text{-}2)$$

The film thickness can be determined in a similar manner for three layers or more.

In the case where the second light transmissive film 18 is a multilayer film, a material having a different refractive index from others is used for each layer. In the case where the second light transmissive film 18 is a multilayer film, it is preferable to construct it so that the further out the layer, the smaller the refractive index becomes. This can reduce the refractive index difference at each interface in the multilayer film, thereby reducing the reflectance for the multilayer film as a whole. As a result, the light transmittance of the second light transmissive film 18 can be made high.

In the case where the light emitting element 1 is sealed with a light transmissive sealing member 4 as in the case of the light emitting device 100 shown in FIG. 2, the second light transmissive film 18 preferably has a higher refractive index than that of the sealing member 4. This reduces the reflectance at the interfaces because neither the refractive index difference between the semiconductor stack 12 and the second light transmissive film 18 nor the refractive index difference between the second light transmissive film 18 and the sealing member 4 is large. As a result, the light transmittance of the second light transmissive film 18 when a sealing member 4 is provided can be made high.

Furthermore, when the second light transmissive film 18 is a single layer AR film, assuming that the refractive index is $n_1$, the refractive index of the semiconductor stack 12 is $n_s$, and the refractive index of the medium, such as the sealing member 4, air, or the like, with which the exterior of the second light transmissive film 18 is in contact is $n_0$, it is preferable to set the refractive index $n_1$ so as to satisfy the relationship represented by the formula (3-1). This theoretically achieves 0% reflectance of the light having the wavelength κ, i.e., 100% light transmittance. However, the absorption of light by the medium or the material for the second light transmissive film 18 is ignored.

$$n_1 \cdot n_1 = n_0 \cdot n_s \quad (3\text{-}1)$$

wherein $n_0 < n_1 < n_s$.

Similarly, when the second light transmissive film 18 is a two-layer AR film, assuming that the refractive indices of the layers from the outside are $n_1$ and $n_2$, the refractive indices $n_1$ and $n_2$ are preferably set to satisfy the relationship represented by the formula (3-2). When the second light transmissive film 18 is a three-layer AR film, assuming that the refractive indices of the layers from the outside are $n_1$, $n_2$, and $n_3$, the refractive indices $n_1$, $n_2$, and $n_3$ are preferably set to satisfy the relationship represented by the formula (3-3).

$$n_2 \cdot n_2 \cdot n_0 = n_1 \cdot n_1 \cdot n_s \quad (3\text{-}2)$$

$$n_1 \cdot n_3 = n_2 \cdot \sqrt{(n_0 \cdot n_s)} \quad (3\text{-}3)$$

wherein $n_0 < n_1 < n_2 < n_3 < n_s$.

Transmittance Simulations

Figure 4:
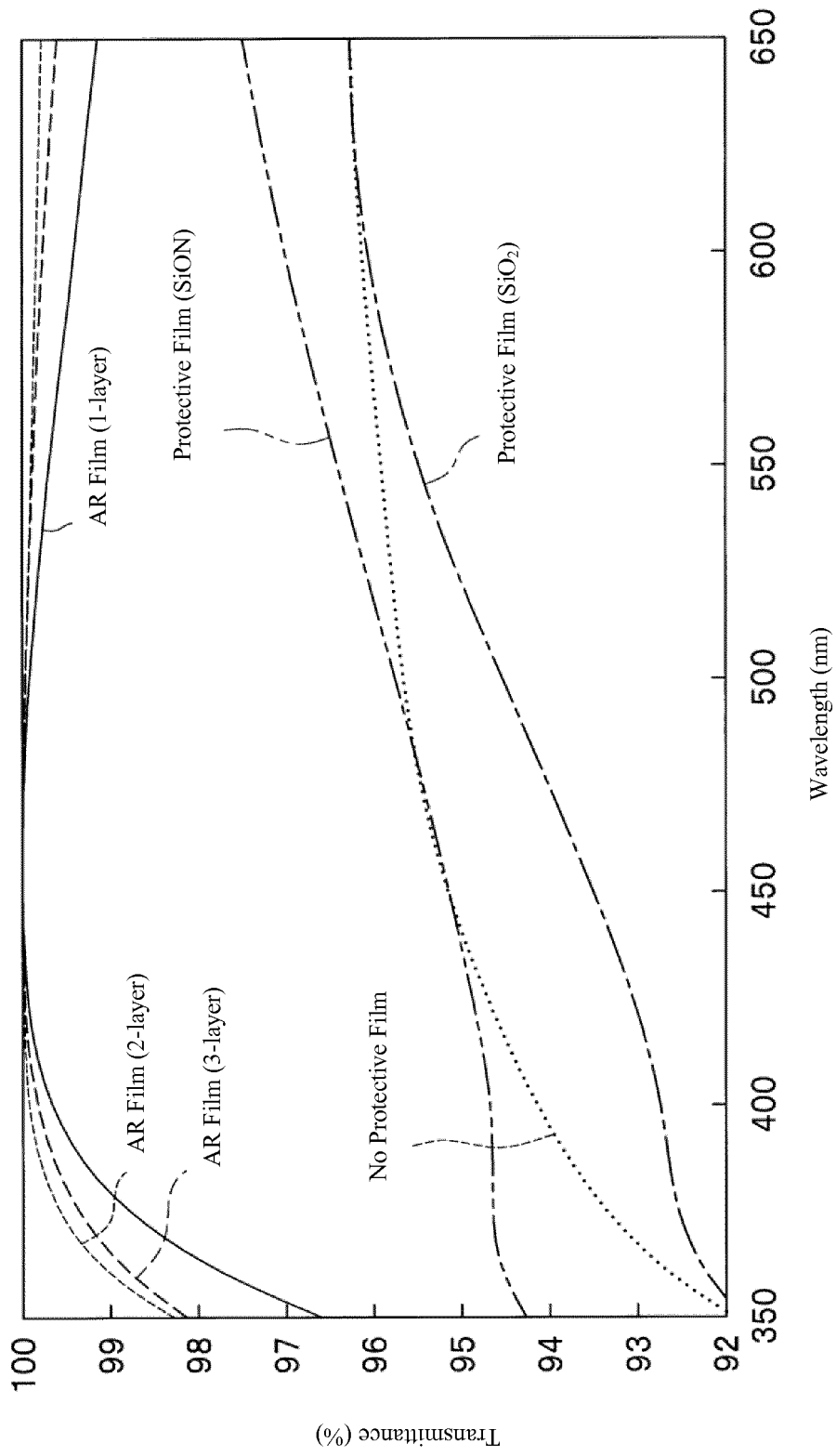
FIG. 4 is a graph showing the simulation results of the wavelength dependency of the transmittances of the first and second light transmissive films used in the light emitting element according to Embodiment 1.

Here, the transmittances of the second light transmissive film 18 and the first light transmissive film 17 will be explained with reference to FIG. 4. In FIG. 4, the "protective film" corresponds to the first light transmissive film 17, and the "AR film" corresponds to the second light transmissive film 18.

FIG. 4 shows the results of the calculations by simulating the dependency of the transmittance of the AR film or the protective film on the wavelength of the light perpendicularly incident on the interface between the semiconductor stack 12 and the AR film (second light transmissive film 18) or the protective film (first light transmissive film 17) in the case of disposing a light transmissive sealing member 4 on the outside.

In FIG. 4, the simulation results are shown for the one-, two-, and three-layer AR films and two types of protective film of different refractive indices. For reference purposes, the transmittance simulation results on the light passing through the interface between the semiconductor stack 12 and the sealing member 4 for the case having no AR film or protective film are also shown.

The simulation conditions for each film are shown below.

| Simulation Conditions for Each Film | | | |
|---|---|---|---|
| Film Name | Material | Refractive Index | Thickness (nm) |
| "AR film (1-layer)" | NSO | 1.94 | 58.6 |
| "AR film (2-layer)" | NSO (inner)/ SiON (outer) | 2.08/1.67 | 54.7/68.2 |
| "AR film (3-layer)" | NSO (inner)/ SiON/SiON (outer) | 2.08/1.72/1.6 | 54.7/66.2/71.1 |
| "Protective film ($SiO_2$)" | $SiO_2$ | 1.49 | 215 |

-continued

Simulation Conditions for Each Film

| Film Name | Material | Refractive Index | Thickness (nm) |
|---|---|---|---|
| "Protective film (SiON)" | SiON | 1.65 | 140 |
| "No protective film" | No material | | |

Other Simulation Conditions

Semiconductor stack: material (GaN): refractive index (2.42)

Sealing member: material (silicone resin): refractive index (1.55)

Vacuum wavelength λ (design wavelength): 455 nm

However, the material, "NSO," represents a mixture of $Nb_2O_5$ and $SiO_2$, and the material, "SiON," represents a mixture of $SiO_2$ and $Si_3N_4$. The composition of each mixture can vary, and by appropriately changing the composition, the refractive index of "SiON" and "NSO" can be adjusted in ranges between about 1.5 and 2.4, and between about 1.5 and 2.1, respectively.

The film thickness t of each layer of the AR film are determined by $t=\lambda/(4 \cdot n_t)$ when the refractive index of each layer is $n_t$ and the vacuum wavelength of light is λ. The refractive index of each layer of the AR film is set to satisfy the formulas (3-1) to (3-3) described above.

Simulation Results

As shown in FIG. 4, as compared to the cases of providing conventional protective films ("protective film ($SiO_2$)" and "protective film (SiON)") and "no protective film," the transmittances were higher for the cases of providing AR films ("AR film (1 layer)," "AR film (2 layer)," and "AR film (3 layer)"). Ignoring the absorption by the media, in particular, the transmittances at the design wavelength, 455 nm, the estimated peak emission wavelength of the light emitting element, was 100%. It is clear that the devices provided with an AR film have high transmittances at both shorter and longer wavelengths than the design wavelength as compared to those having a protective film or no protective film.

It is clear, moreover, that the transmittance declines are slightly larger for the AR films, but the transmittances at longer wavelengths than 455 nm are maintained high as the number of layers having different refractive indices increased. Accordingly, in cases where the structure of the light emitting device includes a sealing member containing a wavelength converting substance (phosphor), for example, where a portion of the light emitted by the light emitting element is converted into light of a longer wavelength, it is preferable to provide a multilayer AR film. A portion of the light whose wavelength has been converted by the wavelength converting substance is incident on the light emitting element, but the multilayer AR film provided can facilitate the extraction of the longer wavelength light incident on the light emitting element.

Referring back to FIG. 1A to FIG. 3, the structure of the light emitting device 100 according to embodiment 1 will be explained.

The mounting substrate 2 is a substrate for mounting the light emitting element 1. For this purpose, the mounting substrate 2 has an insulating base 21, upper wiring 22 disposed on the upper surface of the base 21 for mounting the light emitting element 1, lower wiring 23 on the lower surface of the base 21 for secondary mounting of the light emitting element 1 onto a circuit board or the like, and via holes 24 created in the thickness direction of the base 21 for electrically connecting the upper wiring 22 and the lower wiring 23.

The light emitting element 1 is die bonded on the upper surface of the mounting substrate 2, and the n-electrode 13 and the p-electrode 15 are electrically connected to the upper electrodes 112 of corresponding polarity using wires 3. On the upper surface of the mounting substrate 2, moreover, a substantially semispherical sealing member 4 covering the light emitting element 1 is disposed.

The mounting substrate 2 shown is one example, without limitation, and can employ any form as long as the light emitting element 1 can be sealed with the sealing member 4. For example, the mounting substrate 2 may be a ceramic package or a resin package having a cavity for installing the light emitting element 1 structured to seal the light emitting element 1 by filling the cavity with a sealing member. It may be structured by mounting the light emitting element 1 on a pair of lead frames which is entirely sealed with a resin or the like except for the external connection portions of the lead frames.

The sealing member 4 is a member having light transmittance for protecting the light emitting element 1 and wires 3 mounted on the upper surface of the mounting substrate 2 from the external environment.

For the material to be used as the sealing member 4, silicone resins, epoxy resins, urea resins, and the like can suitably be used. Moreover, these resin materials may contain a wavelength converting substance (phosphor), coloring agent, light diffusion substance, and other fillers.

The sealing member 4 is not limited to resin materials, and can be an inorganic material which is highly light resistant, such as glass.

For the phosphor, wavelength converting substances, those known in the art, such as YAG (yttrium aluminum garnet) phosphors, LAG (lutetium aluminum garnet) phosphors, KSF ($K_2SiF_6$:Mn) phosphors, or the like, can be used.

The sealing member 4, moreover, is not limited to those of the type that is in contact with the light emitting element 1, and can be a cover member for hermetically sealing the light emitting element 1 via a layer of air, nitrogen gas, other inert gas, or vacuum. In this case, it is preferable to select a material for an AR film, if used as the second light transmissive layer 18, that satisfies the relationship represented by the above formulas (3-1) to (3-3) with the medium such as an air layer which is externally in contact with the AR film. Accordingly, when the medium externally in contact with the second light transmissive film 18 has a low refractive index, such as air, it suffices to use a material for the second light transmissive film 18 having a higher refractive index than that of the medium with which it is in contact.

Light Emitting Device Operation

Figure 1B:
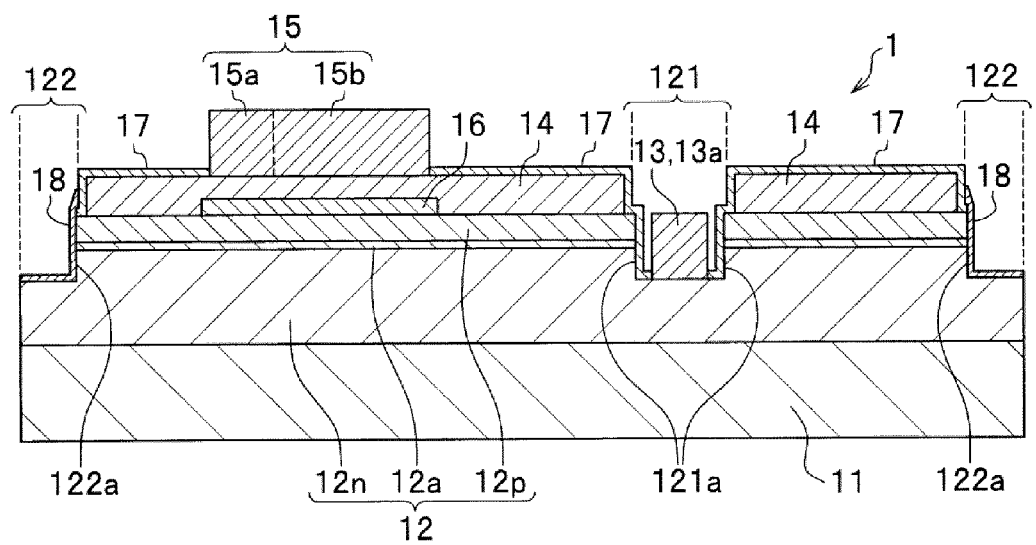
FIG. 1B is a sectional view along line IB-IB indicated in FIG. 1A showing the structure of the light emitting element according to Embodiment 1.

Next, the operation of the light emitting device 100 according to Embodiment 1 will be explained with reference to FIG. 1A to FIG. 2.

The light emitting element 1 is such that current is supplied between the n-side semiconductor layer 12n and the p-side semiconductor layer 12p to allow the active layer 12a to emit light when an external power supply is connected to the external connection portion 13a and the external connection portion 15a via the mounting substrate 2 and the wires 3.

The light emitted by the active layer 12a of the light emitting element 1 propagates inside the semiconductor stack 12, passes through the light transmissive electrode 14 and the first light transmissive film 17, or the second light transmissive film 18, and exits from the upper surface or the lateral surfaces of the light emitting element 1. The light exiting the light emitting element 1 further passes through the sealing member 4 and is extracted from the light emitting device 100.

In more detail, a portion of the light incident on the lateral surfaces 121a of the first area 121 of the semiconductor stack 12 passes through the first light transmissive film 17 and is irradiated against the lateral surfaces of the n-electrode 13, while the other portion is reflected by the first light transmissive film 17 which has a high reflectance and returned inside the semiconductor stack 12. The light which has been returned to the semiconductor stack 12 passes through the upper surface and the lateral surfaces in other areas, and is extracted from the light emitting element 1.

A portion of the light incident on the lateral surfaces 122a of the second areas 122 of the semiconductor stack 12 is reflected by the second light transmissive film 18 and returned inside the semiconductor stack 12, while the other portion passes through the second light transmissive film 18 which has high transmittance, further passes through the sealing member 4 and is extracted.

As described above, the light extraction efficiency can be increased by providing the second light transmissive film 18 at the lateral surfaces 122a of the second areas 122 where the n-electrode 13 is not disposed so as to facilitate the emission of light therefrom, while providing the first light transmissive film 17 at the lateral surfaces 121a of the first area 121 where the n-electrode 13 which readily absorbs light is disposed so as to reflect and return to the semiconductor stack 12 as much light as possible.

Moreover, in the case where the sealing member 4 contains a wavelength converting substance, the wavelength converting substance converts at least a portion of the light extracted from the light emitting element 1 into light of a longer wavelength. The wavelength-converted light is extracted through the sealing member 4, but a portion thereof will enter the light emitting element 1. Accordingly, a portion of the light that has undergone wavelength conversion would also be extracted from the lateral surfaces of the semiconductor stack 12.

Disposing an AR film, preferably a multilayer AR film, as the second light transmissive film 18 at the lateral surfaces 122a of the second areas 122 allows for the light having a longer wavelength than the emission wavelength of the light emitting element 1 to pass through at a high rate of transmittance. This consequently can increase the light extraction efficiency of the light emitting device 100.

Method for Producing Light Emitting Device

Figure 5:
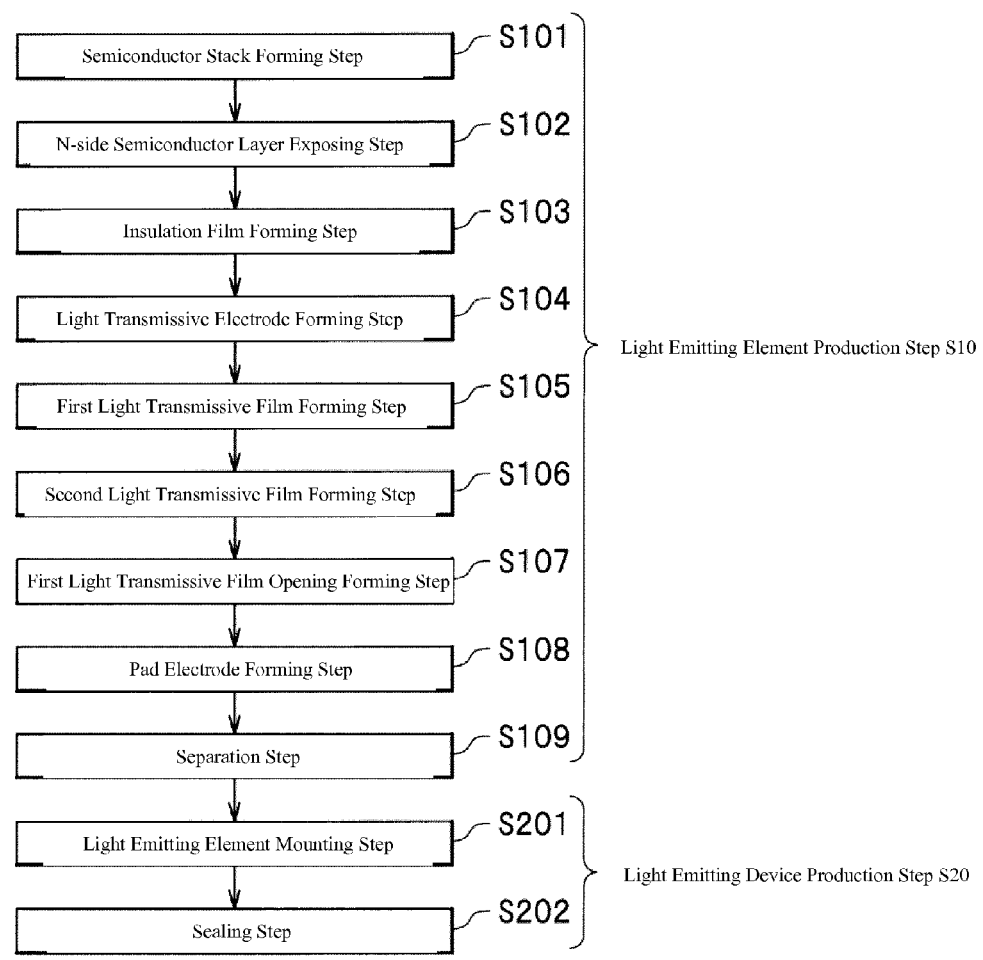
FIG. 5 is a flowchart of the method for producing the light emitting device according to Embodiment 1.

The method for producing the light emitting device 100 will be explained next with reference to FIG. 5.

The method for producing the light emitting device 100 according to this embodiment includes a light emitting element production step S10 and a light emitting device production step S20.

The light emitting element production step S10 includes a semiconductor stack forming step S101, an n-side semiconductor layer exposing step S102, an insulation film forming step S103, a light transmissive electrode forming step S104, a first light transmissive film forming step S105, a second light transmissive film forming step S106, a first light transmissive film opening forming step S107, a pad electrode forming step S108, and a separation step S109.

The light emitting device production step S20 includes a light emitting element mounting step S201 and a sealing step S202.

Each step will be explained in detail below with reference to FIG. 6A to FIG. 7B, and FIG. 1A to FIG. 3, and FIG. 5, as needed.

Light Emitting Element Production Step S10

Figure 6A:
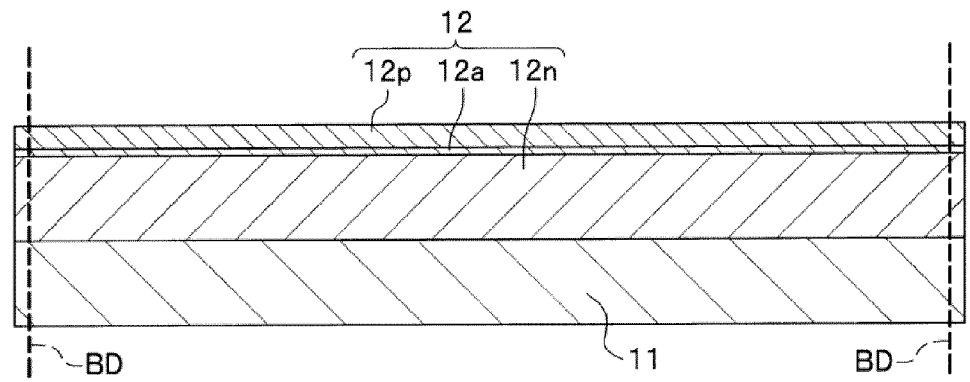
FIG. 6A is a sectional view showing the semiconductor stack forming step in the method for producing the light emitting device according to Embodiment 1.

First, in the semiconductor stack forming step S101, as shown in FIG. 6A, a semiconductor stack 12 is formed on the substrate 11.

In this step, the semiconductor stack 12 is formed by sequentially stacking on one principal plane of the substrate 11 made of sapphire an n-side semiconductor layer 12n, an active layer 12a, and a p-side semiconductor layer 12p, for example, by MOCVD using the aforementioned nitride semiconductor materials.

Each step of the light emitting element production step S10 is performed in the wafer level process where a plurality of light emitting elements 1 are formed on a single wafer substrate 11. In other words, a plurality of light emitting elements 1 are formed on the substrate 11 in a one-dimensional or two-dimensional array.

Figure 6B:
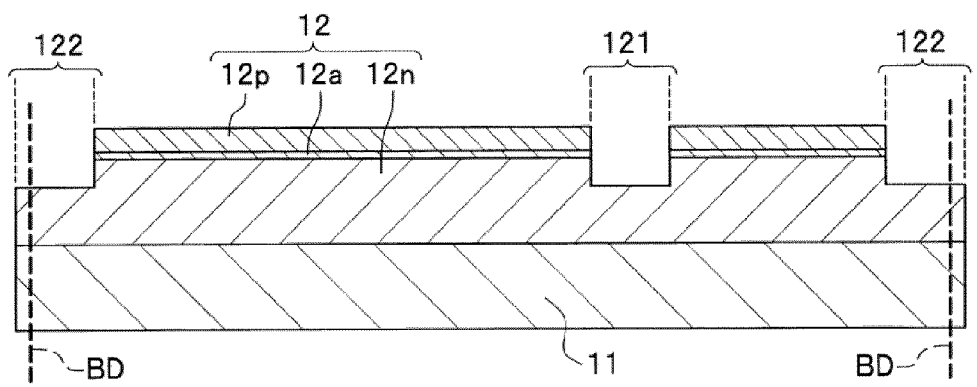
FIG. 6B is a sectional view showing the n-side semiconductor exposing step in the method for producing the light emitting device according to Embodiment 1.

Next, in the n-side semiconductor layer exposing step S102, as shown in FIG. 6B, areas exposing the n-side semiconductor layer 12n are formed in the first area 121 for forming the n-electrode 13, and in the areas along the border lines BD which are imaginary lines defining plural light emitting elements 1, i.e., the second areas 122 which include the outer edges of individual light emitting elements 1.

The second areas 122 are bordering areas, dicing streets, used when the light emitting elements 1 are cut into individual pieces in the separation step S109.

The first area 121 and the second areas 122 can be formed by forming a resist pattern by photolithography, for example, having openings in the areas where the first area 121 and the second areas 122 will be formed, followed by etching the upper surface of the semiconductor stack 12 using the resist pattern as an etching mask until the n-side semiconductor layer 12n is exposed.

Figure 6C:
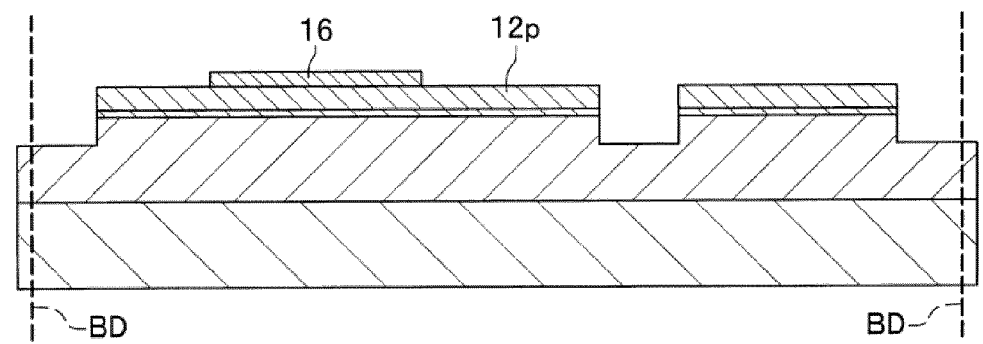
FIG. 6C is a sectional view showing the insulation film forming step in the method for producing the light emitting device according to Embodiment 1.

Then, in the insulation film forming step S103, as shown in FIG. 6C, an insulation film 16 is formed on the p-side semiconductor layer 12p in the area where the p-electrode 15 will be disposed, and its vicinity.

The insulation film 16 can be formed by producing a film across the entire surface of the semiconductor stack 12 by sputtering, for example, using a material such as $SiO_2$, followed by patterning by the lift-off process.

Figure 6D:
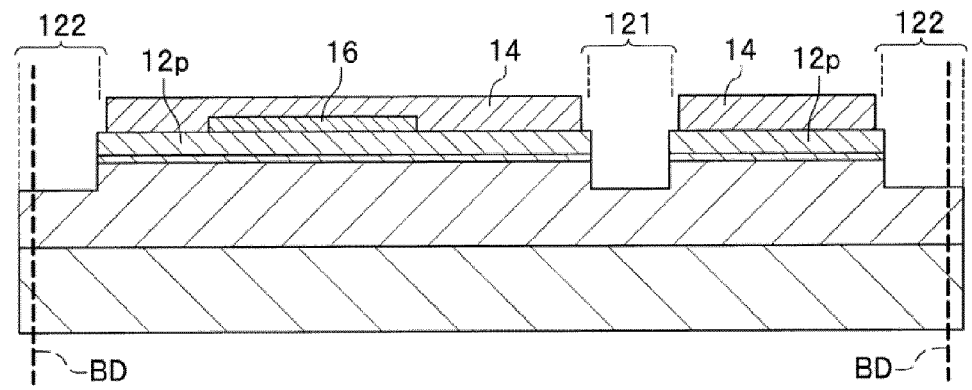
FIG. 6D is a sectional view showing the light transmissive electrode forming step in the method for producing the light emitting device according to Embodiment 1.

Then, in the light transmissive electrode forming step S104, as shown in FIG. 6D, a light transmissive electrode 14 is formed so as to cover substantially the entire upper surface of the p-side semiconductor layer 12p and the insulation film 16. The light transmissive electrode 14 can be formed by sputtering, for example, using a material such as ITO, followed by etching using an etching mask formed by photolithography.

Figure 6E:
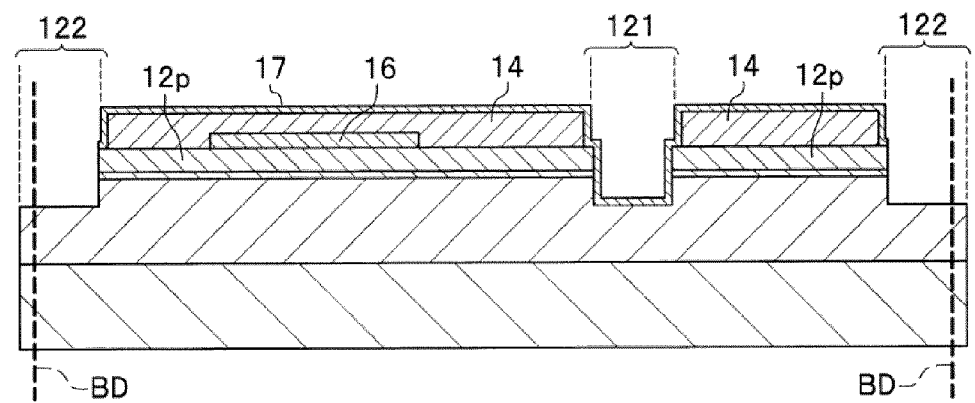
FIG. 6E is a sectional view showing the first light transmissive film forming step in the method for producing the light emitting device according to Embodiment 1.

Next, in the first light transmissive film forming step S105, as shown in FIG. 6E, a first light transmissive film 17 is formed by sputtering or vapor deposition using a material such as $SiO_2$. The patterning of the first light transmissive film 17 can be accomplished by etching using a mask formed by photolithography.

In this step, the first light transmissive film 17 is formed so as not to cover the second areas 122.

Figure 6F:
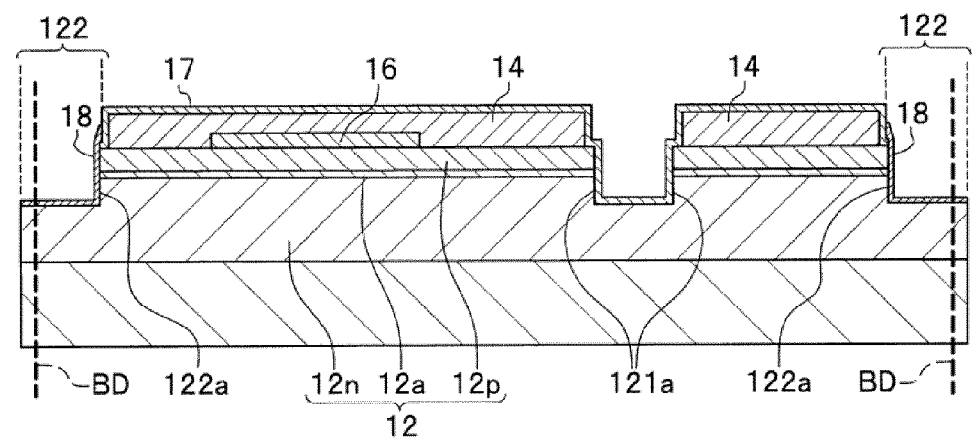
FIG. 6F is a sectional view showing the second light transmissive film forming step in the method for producing the light emitting device according to Embodiment 1.

Then, in the second light transmissive film forming step S106, as shown in FIG. 6F, a second light transmissive film 18 is formed by sputtering, vapor deposition, or the like, using a material such as NSO, SiON, or the like. The patterning of the second light transmissive film 18 can be accomplished by the lift-off process.

The second light transmissive film 18 is disposed so as to cover the second areas 122, preferably overlap the first light transmissive film 17 at the ends. Furthermore, it may be disposed to extend onto the upper surface of the first light transmissive film 17. By overlapping the ends of the second light transmissive film 18 with the first light transmissive film 17, the barrier properties as a protective film can be increased.

Figure 6G:
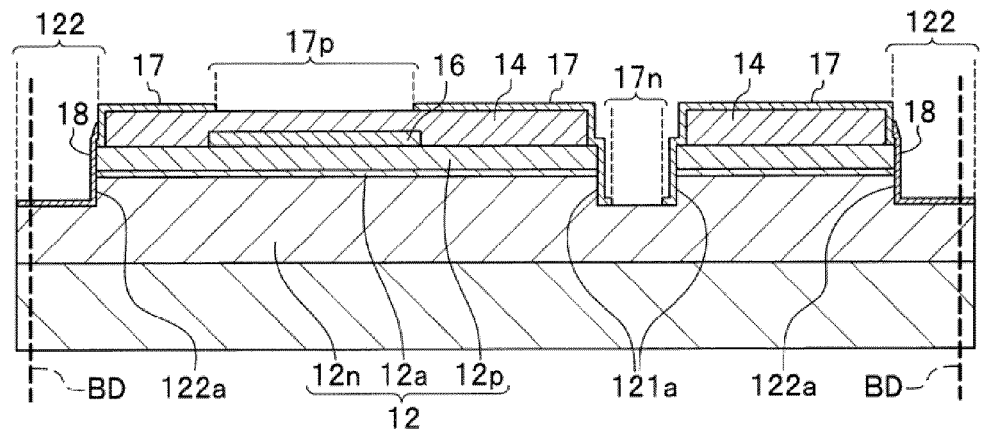
FIG. 6G is a sectional view showing the first light transmissive film opening forming step in the method for producing the light emitting device according to Embodiment 1.

Next, in the first light transmissive film opening forming step S107, as shown in FIG. 6G, an opening 17n which exposes the n-side semiconductor layer 12n is formed in the first area 121, and an opening 17p which exposes the light transmissive electrode 14 is formed on the upper surface of the light transmissive electrode 14.

In this step, a mask having openings at the areas for disposing the n-electrode 13 and the p-electrode 15 at the bottom of the first area 121 and on the light transmissive electrode 14 is formed by photolithography, and the first light transmissive film 17 inside the openings of the mask is removed by etching. This exposes the n-side semiconductor layer 12n at the bottom surface of the first area 121 while exposing a portion of the upper surface of the light transmissive electrode 14.

Figure 6H:
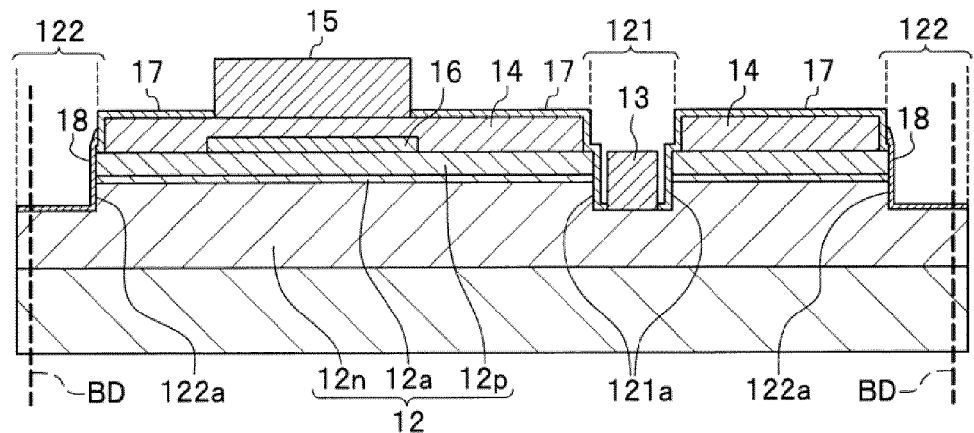
FIG. 6H is a sectional view showing the pad electrode forming step in the method for producing the light emitting device according to Embodiment 1.

Next, in the pad electrode forming step S108, as shown in FIG. 6H, an n-electrode 13 connected to the n-side semiconductor layer 12n is formed in the opening 17n and a p-electrode 15 connected to the light transmissive electrode 14 is formed in the opening 17p.

In this step, a metal film is formed as the n-electrode 13 and the p-electrode 15 using the aforementioned metal materials by sputtering, vapor deposition, or the like, without removing the mask used for the etching in the first light transmissive film opening forming step S107. Then, the n-electrode 13 and the p-electrode 15 can be formed by patterning the metal film by removing the mask, i.e., the lift-off process.

If the same material is used for both the n-electrode 13 and the p-electrode 15, they can be formed simultaneously. If different materials are used for the n-electrode 13 and the p-electrode 15, it suffices to form them in separate steps.

Figure 6I:
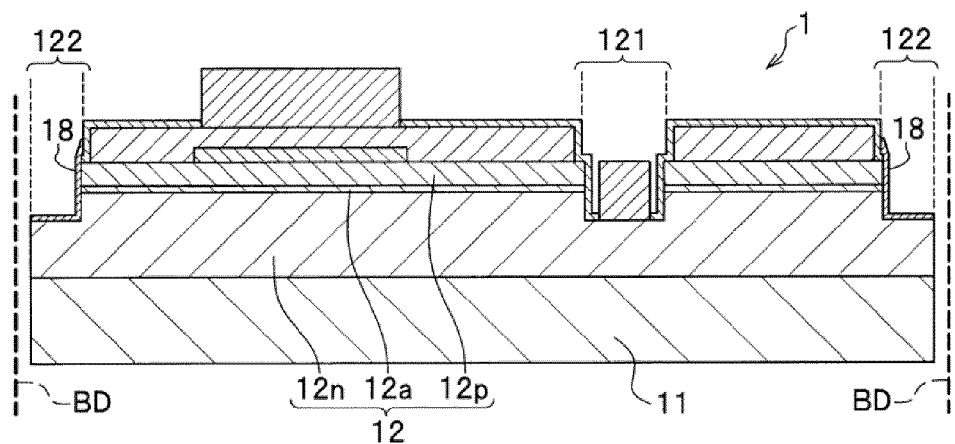
FIG. 6I is a sectional view showing the separation step in the method for producing the light emitting device according to Embodiment 1.

Next, in the separation step S109, as shown in FIG. 6I, light emitting elements 1 are separated into individual pieces by cutting the wafer along the border lines BD set over the second areas 122 by dicing, scribing, or the like.

The substrate 11 may be thinned down by polishing the back surface thereof before cutting the wafer. Moreover, before or after separating them into individual pieces, a reflecting layer made of a metal film or a distributed Bragg reflector (DBR) can be disposed on the rear surface of the substrate 11.

The light emitting element 1 can be formed by performing the steps described above.

Variations of the Light Emitting Element Production Step S10

The pad electrode forming step S108 may be performed before the first light transmissive film forming step S105. In other words, the n-electrode 13 and the p-electrode 15 may be formed first, followed by forming the first light transmissive film 17 and the second light transmissive film 18. In this case, in the first light transmissive film forming step S105, patterning of the first light transmissive film 17 is performed so as to expose the n-electrode 13 and the p-electrode 15 which are pad electrodes.

Light Emitting Device Production Step S20

Figure 7A:
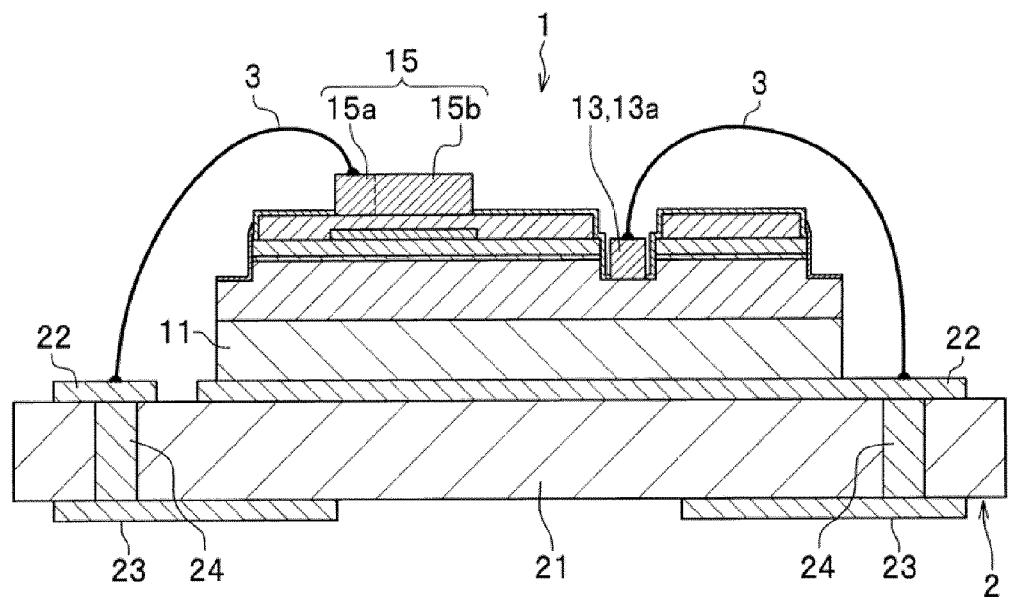
FIG. 7A is a sectional view showing the light emitting element mounting step in the method for producing the light emitting device according to Embodiment 1.

Next, in the light emitting element mounting step S201, as shown in FIG. 7A, the light emitting element 1 is mounted on the mounting substrate 2. In this step, the light emitting element 1 is bonded to the mounting substrate 2 at a prescribed position using a die bonding member, such as a resin, solder, or the like. Then, the external connection portions 13a and 15a of the n-electrode 13 and the p-electrode 15, respectively, are electrically connected to the upper wiring 22 of the mounting substrate 2 of the corresponding polarities using wires 3.

Figure 7B:
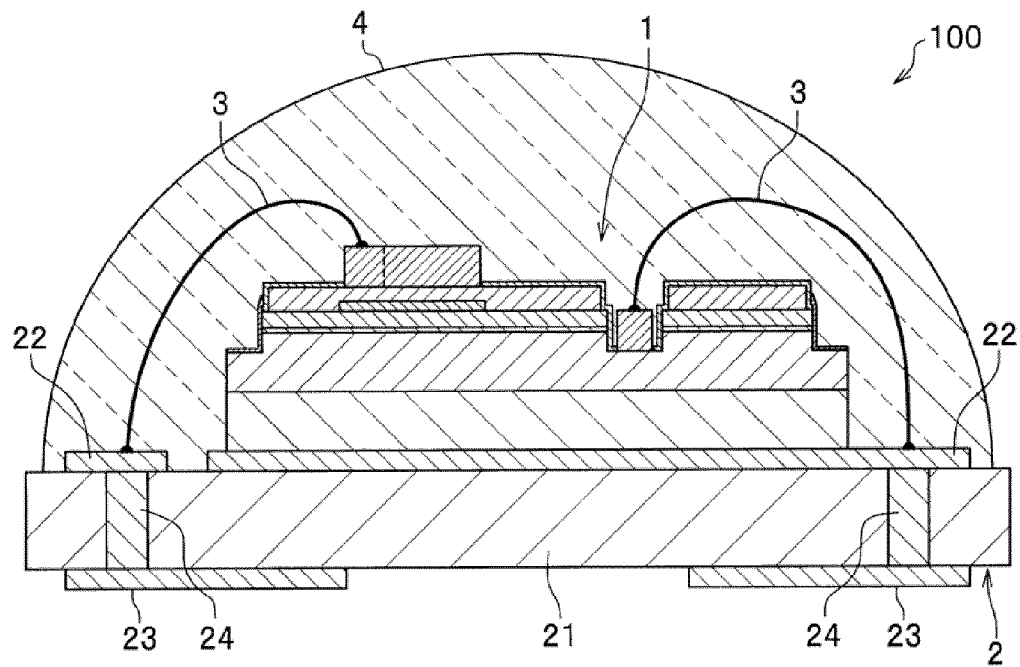
FIG. 7B is a sectional view showing the sealing step in the method for producing the light emitting device according to Embodiment 1.

Then, in the sealing step S202, as shown in FIG. 7B, the light emitting element 1 and the wires 3 are sealed using a sealing member 4. The sealing member 4 may contain particles of a phosphor, which is a wavelength converting substance, light reflecting substance, light diffusion substance, coloring agent, or any other filler.

A resin material can suitably be used as the base material for the sealing member 4. The sealing member 4 can be formed by injection molding if a thermoplastic resin is used as the resin material, and by transfer molding if a thermosetting resin is used. The sealing member 4 can alternatively be formed by using various coating methods, such as potting, spraying, inkjetting, and screen printing.

The light emitting device 100 can be produced by performing the steps described above.

Embodiment 2

Light Emitting Element Structure

The light emitting element according to Embodiment 2 will be explained with reference to FIG. 8A and FIG. 8B.

Figure 8A:
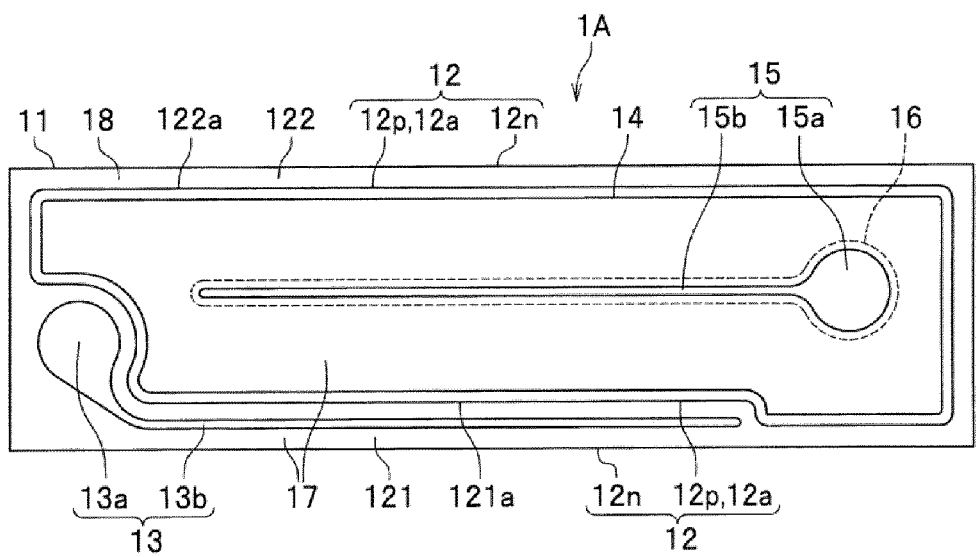
FIG. 8A is a plan view showing the structure of the light emitting element according to Embodiment 2.
Figure 8B:
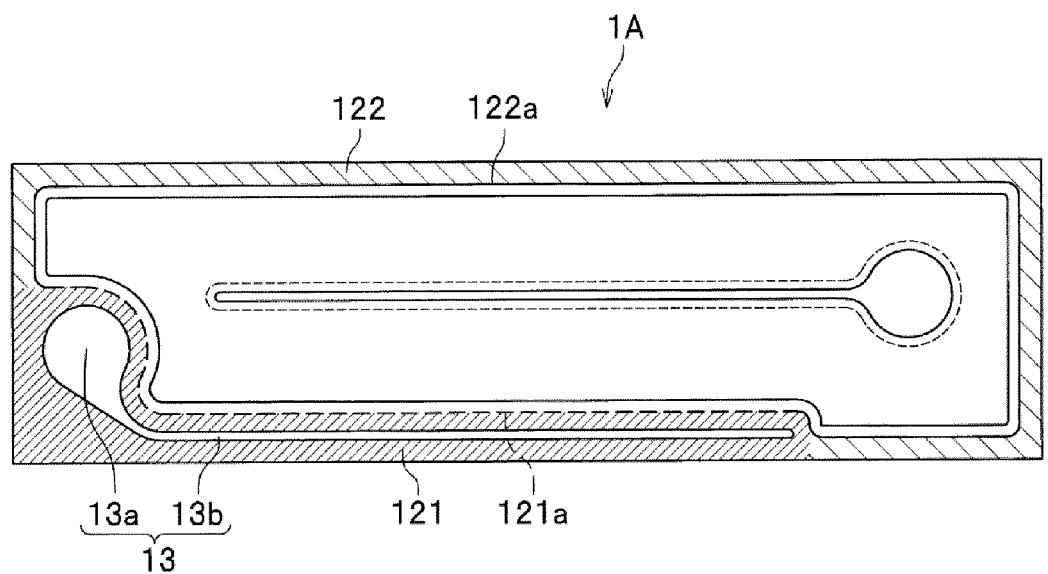
FIG. 8B is a plan view showing the first area and the second areas in the light emitting element according to Embodiment 2.

The light emitting element 1A according to Embodiment 2 is a horizontally long oblong in a plan view, and the first area 121 is located along the two sides, the left and bottom sides of the oblong in FIG. 8A. In other words, the n-electrode 13 is disposed in the area along a portion of the outer edge of the light emitting element 1A, not in the area surrounded by the semiconductor stack 12. Among the peripheral areas of the light emitting element 1A, the area where the n-electrode 13 is disposed is the first area 121, which is the area with hatching lines going up to the right in FIG. 8B, and the remaining area is the second area 122, which is the area with the hatching lines going down to the right in FIG. 8B.

The lateral surfaces 121a of the first area 121 of the semiconductor stack 12 are provided with the first light transmissive film 17, and the lateral surfaces 122a of the second area 122 are provided with the second light transmissive film 18.

In the plan view FIG. 8A, the outlines of the first light transmissive film 17 and the second light transmissive film 18 are omitted.

The light emitting element 1A is different from the light emitting element 1 of Embodiment 1 in terms of the outline, and the locations and shapes of the n-electrode 13 and the p-electrode 15, but the materials for each components of the light emitting element 1A are similar to those of the light emitting element 1. For this reason, the detailed explanation of each component of the light emitting element 1A, the operation of and the production method for the light emitting element 1A will be omitted.

The light emitting device 100 described above can be constructed using the light emitting element 1A in lieu of the light emitting element 1. In doing so, the light emitting device 100 can be constructed by forming the shapes of the mounting substrate 2 and sealing member 4 in correspondence with the shape of the light emitting element 1A.

EXAMPLES

As Example 1, a light emitting element having a single layer AR film for the second light transmissive film and the shape shown in FIG. 1A was produced, and its emission output Po and forward voltage Vf were measured. As Comparative Example 1, a light emitting element having the same shape as Example 1, and the first light transmissive film also on the lateral surfaces of the second areas in lieu of the second light transmissive film was produced, and its emission output Po and forward voltage Vf were measured.

Similarly, light emitting elements having the shape shown in FIG. 7A were prepared as Example 2 and Comparative Example 2, and their emission output Po and forward voltage Vf were measured.

TABLE 1 shows the production conditions for each sample.

TABLE 1

|  |  | Example 1 | Comparative Example 1 | Example 2 | Comparative Example 2 |
|---|---|---|---|---|---|
| Semiconductor Stack | Dice Size (μm) | 650 × 650 | 650 × 650 | 850 × 240 | 850 × 240 |
|  | Material | GaN-based | GaN-based | GaN-based | GaN-based |
|  | Refractive Index | 2.42 | 2.42 | 2.42 | 2.42 |
|  | Wavelength (nm) | 455 | 455 | 455 | 455 |
| Light Transmissive Electrode | Material | ITO | ITO | ITO | ITO |
|  | Refractive Index | 1.97 | 1.97 | 1.97 | 1.97 |
|  | Film Thickness (nm) | 60 | 60 | 80 | 80 |
| First Light Transmissive Film | Material | $SiO_2$ | $SiO_2$ | $SiO_2$ | $SiO_2$ |
|  | Refractive Index | 1.49 | 1.49 | 1.49 | 1.49 |
|  | Film Thickness (nm) | 300 | 300 | 300 | 300 |
| Second Light Transmissive Film (Single-layer AR film) | Material | NSO | — | NSO | — |
|  | Refractive Index | 1.94 |  | 1.94 |  |
|  | Film Thickness (nm) | 59 |  | 59 |  |

Besides the conditions shown in TABLE 1, the production conditions for the n-electrode, the p-electrode, and the insulation film as common conditions for Examples 1 and 2 and Comparative Examples 1 and 2 are listed below.
Conditions Common to Examples 1, 2, Comparative Examples 1, and 2
N-Electrode
  Materials: a stack of Al-based multilayer film/Cr—Rh-based alloy/Pt/Au from the bottom.
  The Al-based multilayer film is a stack of Ti/Al—Cu-based alloy/Ti/Ru from the bottom.
P-Electrode
  Materials: a stack of Cr—Rh-based alloy/Pt/Au from the bottom.
Insulation Film
  Material: $SiO_2$ (refractive index 1.49)
  Thickness: 215 nm
Measurements TABLE 2 shows the results of measurements for each sample.

The forward current applied to Example 1 and Comparative Example 1 during the measurements was 65 mA. The forward current applied to Example 2 and Comparative Example 2 during the measurements was 20 mA.

TABLE 2

|  | Example 1 | Comparative Example 1 | Example 2 | Comparative Example 2 |
|---|---|---|---|---|
| Emission Output Po (mW) | 136.89 | 136.52 | 42.02 | 41.82 |
| Forward Voltage Vf (V) | 2.905 | 2.906 | 2.814 | 2.813 |

The emission output Po of Example 1 was confirmed to be 0.27% higher than that of Comparative Example 1.

The emission output Po of Example 2 was confirmed to be 0.48% higher than that of Comparative Example 2.

Both Examples 1 and 2 were conformed to have similar forward voltages Vf to those of Comparative Examples 1 and 2, respectively.

In other words, disposing a second light transmissive film, which has a higher refractive index than that of the first light transmissive film disposed in the first area, in the second areas was confirmed to be effective in increasing the emission output Po.

The light emitting elements and the light emitting devices according to the invention have been specifically explained in the forgoing. The invention, however, is not limited by those described above, and must be broadly interpreted based on the claims section. It goes without saying that various modifications and alterations made based thereon also fall within the scope of the invention.

What is claimed is:
1. A light emitting element comprising:
  a semiconductor stack including an n-side semiconductor layer, and a p-side semiconductor layer disposed in a portion of an area above the n-side semiconductor layer, the semiconductor stack having a plurality of first lateral surfaces and a plurality of second lateral surfaces;
  an n-pad electrode disposed in an area different from an area where the p-side semiconductor layer is disposed above the n-side semiconductor layer, the n-pad electrode being electrically connected to the n-side semiconductor layer, and the n-pad electrode having a plurality of lateral surfaces that oppose the first lateral surfaces of the semiconductor stack;
  a first light transmissive film disposed in contact with the first lateral surfaces of the semiconductor stack; and
  a second light transmissive film disposed in contact with the second lateral surfaces of the semiconductor stack;
  wherein a refractive index of the second light transmissive film is lower than a refractive index of the semiconductor stack, and higher than a refractive index of the first light transmissive film.
2. The light emitting element according to claim 1, wherein a film thickness of the second light transmissive film is $\kappa/(4 \cdot n)$ when the refractive index of the second light transmissive film is n and a vacuum wavelength of light emitted by the semiconductor stack is λ.

3. The light emitting element according to claim 2, wherein the second light transmissive film is a multilayer film in which multiple types of light transmissive materials having different refractive indices are stacked, and when a refractive index of each layer of the multilayer film is $n_i$ (i being an index to identify each layer), a film thickness of each layer is $\lambda/(4 \cdot n_i)$.

4. The light emitting element according to claim 1, further comprising:

a light transmissive electrode covering substantially an entire upper surface of the p-side semiconductor layer and electrically connected to the p-side semiconductor layer, and a p-pad electrode electrically connected to the light transmissive electrode in one area of the upper surface of the light transmissive electrode, wherein an upper surface and lateral surfaces of the light transmissive electrode are covered by the first light transmissive film.

5. A light emitting device comprising:

the light emitting element according to claim 1, and a light transmissive sealing member covering the light emitting element, wherein the refractive index of the second light transmissive film is higher than a refractive index of the sealing member.

6. The light emitting device according to claim 5, wherein the sealing member contains a wavelength converting substance adapted to convert light emitted by the light emitting element into light of a longer wavelength than a wavelength of the light emitted by the light emitting element.

* * * * *